United States Patent [19]

Shogaki et al.

[11] Patent Number: 4,926,137
[45] Date of Patent: May 15, 1990

[54] TRANSISTOR AMPLIFIER FOR OUTPUTTING A VOLTAGE WHICH IS HIGHER THAN A BREAKDOWN VOLTAGE OF THE TRANSISTOR

[75] Inventors: Toshihiro Shogaki, Takatsuki; Toyohiro Shibayama, Neyagawa; Noriaki Omoto, Takatsuki, all of Japan

[73] Assignee: Matsushita Electric Industrial Co., Ltd., Kadoma, Japan

[21] Appl. No.: 388,869

[22] Filed: Aug. 3, 1989

[30] Foreign Application Priority Data

Aug. 5, 1988 [JP] Japan .............................. 63-196524
Aug. 5, 1988 [JP] Japan .............................. 63-196525

[51] Int. Cl.$^5$ .............................................. H03F 3/45
[52] U.S. Cl. ........................................ 330/252; 330/297; 330/311
[58] Field of Search ................. 330/252, 297, 311, 71, 330/74

[56] References Cited

PUBLICATIONS

Liu et al, "Amplifier Circuit with Large Output Signal Swing," IBM Technical Disclosure Bulletin, vol. 15, No. 5, Oct. 1972, pp. 1430, 1431.

Primary Examiner—James B. Mullins
Attorney, Agent, or Firm—Cushman, Darby & Cushman

[57] ABSTRACT

A first and a second transistors coupled in series by connecting the collector of the first one to the emitter of the second one are connected at the collector of the second transistor through a resistor to a first power source of a voltage as high as about two times the breakdown voltage of these transistors, a third transistor is coupled at the collector to the base of the second transistor and a second power source of the lower voltage than the first power source through a load resistor, and the base of the third transistor is connected to the base of the first transistor; whereby an output voltage of the second transistor is divided into the respective collector-emitter voltages of the first and second transistors, and the output voltage exceeding the breakdown voltage of the transistor is obtainable.

2 Claims, 4 Drawing Sheets

TRANSISTOR AMPLIFIER FOR OUTPUTTING A VOLTAGE WHICH IS HIGHER THAN A BREAKDOWN VOLTAGE OF THE TRANSISTOR

FIELD OF THE INVENTION AND RELATED ART STATEMENT

1. Field of the invention

The present invention relates generally to an amplifier, and more particularly to a transistor amplifier for outputting a voltage which is higher than a breakdown voltage of the transistor.

2. Description of the Related Art

Recently, a semiconductor integrated circuit has progressed in dense integration of transistors, hence decreasing area of the transistor, and a breakdown voltage across the collector and emitter of the transistor is resultantly lowered. Generally, an output level of an amplifier is restricted by the breakdown voltage of a transistor used in the amplifier, and hence is lowered in compliance with decrease of the breakdown voltage.

FIG. 1 is a circuitry of an example of the conventional amplifier that are familiar to one skilled in the art. Referring to FIG. 1, a transistor 6 is connected at the collector to an electric power source 9 of a voltage of $V_{CC}$ through a resistor 10 of a resistance $R_L$, and is connected at the emitter to a circuit ground Gr through a resistor 11 of a resistance $R_E$. A gain G of the amplifier is approximately represented by $$G \approx \frac{R_L}{R_E}. \quad (1)$$

FIG. 2 is a graph showing the collector voltage $V_C$ and emitter voltage $V_E$ with respect to a base voltage $V_B$. The gain G is represented by a gradient of the curve of collector voltage $V_C$. A voltage $V_{CE}$ across the collector and emitter (hereinafter is referred to as a collector-emitter voltage $V_{CE}$) is given by $$V_{CE} = V_C - V_E \quad (2).$$

Furthermore, when the voltage of the power source is represented by $V_{CC}$, and the emitter current of the transistor 6 is represented by $I_E$, assuming that a current amplification factor $h_{FE}$ of the transistor 6 is infinite, the collector voltage $V_C$ is given by $$V_C = V_{CC} - I_E R_L \quad (3),$$

and the emitter voltage $V_E$ is given by $$V_E = V_B - V_{BE} \quad (4),$$

where, the voltage $V_{BE}$ represents a voltage across the base and the emitter of the transistor 6.

In the above-mentioned amplifier, when the input voltage $V_B$ is equal to the ground level, the collector-emitter voltage $V_{CE}$ is equal to the power source voltage $V_{CC}$. Therefore, the power source voltage $V_{CC}$ must be selected to be less than the breakdown voltage $BV_{CE}$ across the collector and the emitter of the transistor. Namely, when the collector-emitter voltage $V_{CE}$ exceeds the breakdown voltage, the collector current suddenly increases and the normal operation of the transistor cannot be maintained. Consequently, the maximum collector voltage $V_C$ is selected equal to or below the power source voltage $V_{CC}$.

As mentioned above, in the conventional amplifier, an output voltage swing DL, which is a voltage range between the maximum output voltage and the minimum output voltage, is inevitably lower than the breakdown voltage of the transistor.

The above-mentioned problem also arises in the case of a differential amplifier.

OBJECT AND SUMMARY OF THE INVENTION

An object of the present invention is to provide an amplifier for generating an output voltage which is higher than a breakdown voltage across the collector and the emitter of a transistor.

The amplifier in accordance with the present invention comprises:

a first transistor connected at the emitter to a circuit ground through a first resistor, a second transistor connected at the emitter to the collector of the first transistor and connected at the collector to an output terminal and through a second resistor to a first power source of a voltage which is higher than the breakdown voltage of the transistors, and a third transistor connected at the collector to the base of the second transistor and through a third resistor to a second power source, connected at the base to the base of the first transistor and connected at the emitter to the circuit ground through a fourth resistor.

In operation of the amplifier, when the base voltages of the first and the third transistors increase, the collector currents of the first and the third transistors decrease. Since the collector current of the first transistor is supplied through the second transistor and the first collector resistor from a power source, the collector voltage of the second transistor decreases, and the collector voltage of the second transistor is a sum of a voltage across the collector and the emitter of the second transistor and the collector voltage of the first transistor, and hence, the maximum collector voltage of the second transistor is a sum of both breakdown voltages across the respective collectors and emitters of the first and second transistors.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1:
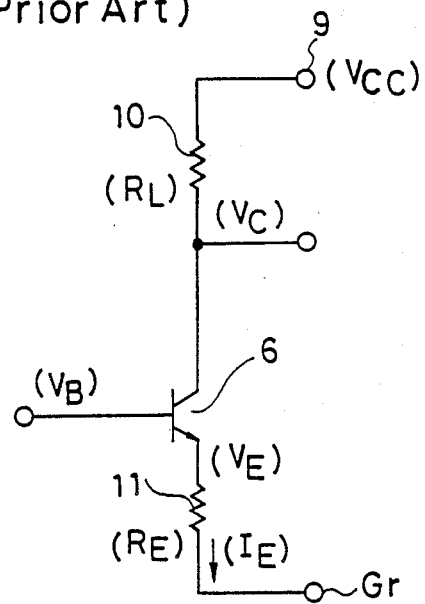
FIG. 1 is the circuitry of the amplifier in the prior art.
Figure 2:
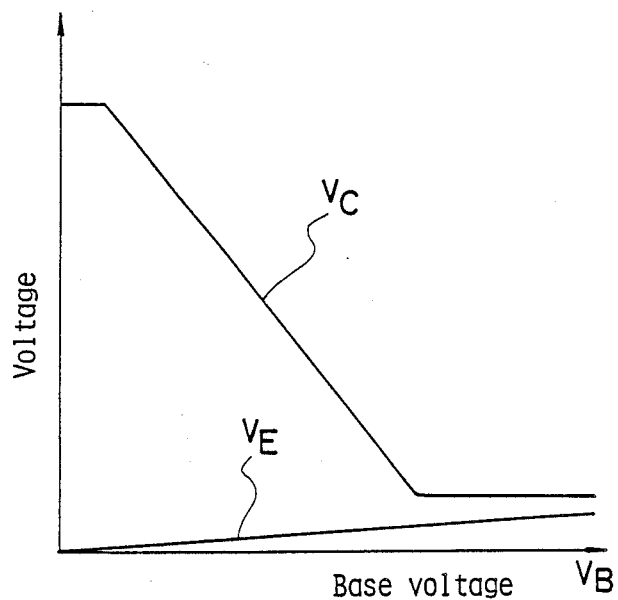
FIG. 2 is the graph illustrating operation of the amplifier as shown in FIG. 1.
Figure 3:
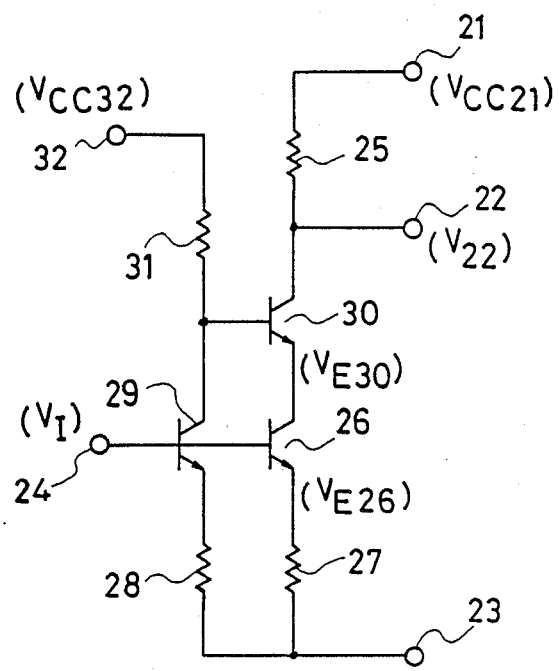
FIG. 3 is the circuitry of a first embodiment of an amplifier in accordance with the present invention.

FIG. 3 is the circuitry of a first embodiment of an amplifier in accordance with the present invention.

Referring to FIG. 3, a first transistor 20 is connected at the collector to the emitter of a second transistor 30, and is connected at the emitter through a resistor 27 to a circuit ground 23. The collector of the transistor 30 is connected to a terminal 21 of a power source $V_{CC21}$ through a resistor 25, and is also connected to an output terminal 22. A third transistor 29 is connected at the emitter through a resistor 28 to the circuit ground 23 and is connected at the collector to the base of the transistor 30. The collector of the transistor 29 is also connected to a terminal 32 of the other power source $V_{CC32}$ through a resistor 31, and the bases of the transistors 26 and 29 are commonly connected to an input terminal 24.

In the amplifier as shown in FIG. 3, collector current of the transistor 30 is equal to that of the transistor 26, and the resistor 25 is a load resistor of the transistor 26, and the resistor 31 is a load resistor of the transistor 29. A gain G1 of an amplifier including the transistor 26 is given by $$G1 \approx \frac{R_{25}}{R_{27}}, \quad (5)$$

where, $R_{25}$ and $R_{27}$ represent resistances of the resistors 25 and 27, respectively.

Then, a gain G2 of an amplifier including the transistor 29 is given by $$G2 \approx \frac{R_{31}}{R_{28}}, \quad (6)$$

where, $R_{28}$ and $R_{31}$ represent resistances of the resistors 28 and 31, respectively.

Figure 4:
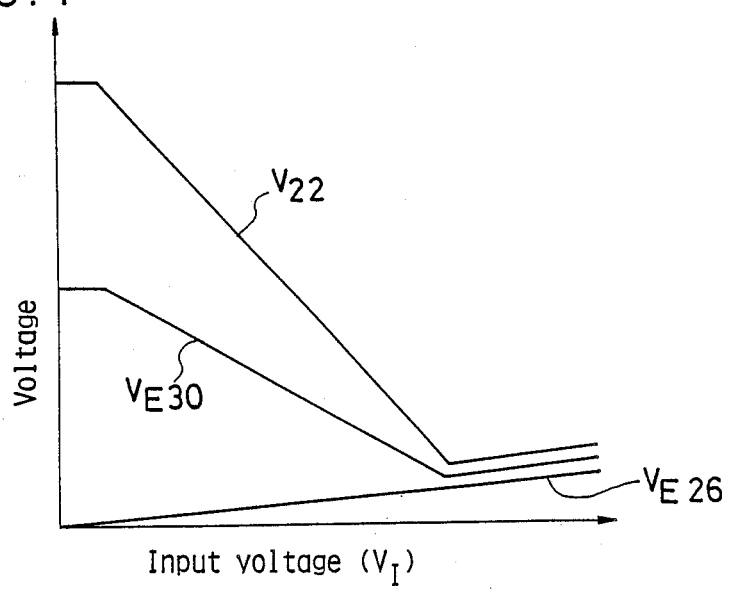
FIG. 4 is a graph illustrating operation of the amplifier as shown in FIG. 3.

FIG. 4 is a graph showing output voltages of the amplifier with respect to an input voltage $V_I$. Referring to FIG. 4, a curve $V_{22}$ represents an output voltage of the output terminal 22, a curve $V_{E30}$ represents an emitter voltage of the transistor 30 and a curve $V_{E26}$ represents an emitter voltage of the transistor 26.

Moreover, voltages of the power source terminal 21 and 32 are represented by $V_{CC21}$ and $V_{CC32}$, respectively. The output voltage $V_{22}$ is given by $$V_{22} = V_{CC21} - G1 \cdot V_{E26} \quad (7),$$

therefor, $$V_{22} = V_{CC21} - \frac{R_{25}}{R_{27}} \cdot V_{E26}, \quad (8)$$

and the emitter voltage $V_{E30}$ is given by $$V_{e30} = V_{CC32} - G2 \cdot V_{E26} - V_{BE30} \quad (9),$$

therefor, $$V_{E30} = V_{CC32} - \frac{R_{31}}{R_{28}} \cdot V_{E26} - V_{BE30}, \quad (10)$$

where, $V_{BE30}$ represents a voltage across the base and emitter of the transistor 30.

Then, the emitter voltage $V_{BE26}$ of the transistor 26 is given by $$V_{E26} = V_{24} - V_{BE26} \quad (11).$$

The gain G1 and the gain G2 correspond with the respective gradients of the curves $V_{22}$ and $V_{E30}$ which are shown by equations (9) and (10), respectively.

Furthermore, in the amplifier in accordance with the present invention, since the transistor 26 is connected in series with the transistor 30, the sum of voltages $V_{CE26}$, $V_{CE30}$ across the respective collector and emitter of the first and second transistors 26, 30 is an approximate output voltage of the amplifier, and thus the maximum output voltage swing becomes a sum of both the breakdown voltages $BV_{CE}$ across the respective collector and emitter of the first and second transistors 26, 30. The voltage $V_{CE30}$ across the collector and emitter of the transistor 30 is given by $$V_{CE30} = V_{CC21} - V_{CC32} + V_{BE30} - \left(\frac{R_{25}}{R_{27}} - \frac{R_{31}}{R_{28}}\right)V_{E26}. \quad (12)$$

The maximum voltage $V_{CE30max}$ which is the maximum voltage of the voltage $V_{CE30}$ is given by $$V_{CE30max} = V_{CC32} - V_{CC32} + V_{BE30} \quad (18).$$

Furthermore, the voltage $V_{CE26}$ across the collector and emitter of the transistor 26 is given by $$V_{CE26} = V_{CC32} - V_{BE30} - \left(\frac{R_{31}}{R_{28}} - 1\right)V_{E26}. \quad (14)$$

The maximum voltage $V_{CE26max}$ which is the maximum voltage of the voltage $V_{CE26}$ is given by $$V_{CE26max} = V_{CC32} - V_{BE30} \quad (15).$$

Consequently, a voltage $V_{CE29}$ across the collector and emitter of the transistor 29 is given by $$V_{CE29} = V_{CC32} - \left(\frac{R_{31}}{R_{28}} - 1\right)(V_{24} - V_{BE29}). \quad (16)$$

Then, the maximum voltage $V_{CE29max}$ of the voltage $V_{CE29}$ is given by $$V_{CE29max} = V_{CC21} \quad (17).$$

Consequently, when the following relations (18), (19) and (20) are fulfilled, the voltages across the collector and emitter of the respective transistors 26, 30 never exceed the breakdown voltages $BV_{CE}$ across the collector and emitter of the respective transistors.

$$\frac{R_{25}}{R_{27}} > \frac{R_{31}}{R_{28}}, \quad (18)$$

$$BV_{CE} \geq V_{CC32}, \quad (19)$$

$$\frac{R_{25}}{R_{25} + R_{27}} V_{CC21} > BV_{CE} > V_{CC21} - V_{CC32} + V_{BE30}. \quad (20)$$

If a saturation voltage across the collector and emitter of the transistor is negligibly small, the maximum voltage swing DL at the output terminal 22 is given by $$DL = \frac{R_{25}}{R_{25} + R_{27}} V_{CC21}. \quad (21)$$

For example, the relations (18), (19) and (20) are fulfilled under the conditions of $V_{CC21}=9$ V, $V_{CC32}=5$ V, $BV_{CE}=5$ V, $R_{27}=R_{28}=1$ KΩ, $R_{25}=17$ KΩ, $R_{31}=9$ KΩ, and $V_{BE}=0.7$ V.

The maximum voltage $V_{CE30max}$ of the voltage $V_{CE30}$ across the collector and emitter of transistor 30 is calculated by the equation (13). Therefore, the maximum voltage $V_{CE30max}$ is 4.7 V, and is lower than the breakdown voltage $BV_{CE}$.

In a similar manner, the maximum voltage $V_{CE26max}$ of the voltage $V_{CE26}$ of the transistor 26 is calculated by the equation (15), and is 4.3 V. Therefore, the maximum voltage $V_{CE26max}$ is lower than the breakdown voltage $BV_{CE}$.

Further, the maximum voltage $V_{CE29max}$ of the voltage $V_{CE29}$ of the transistor 29 is calculated by the equation (17), and is 5 V, and therefore, the maximum voltage $V_{CE29max}$ is equal to the breakdown voltage $BV_{CE}$.

On the other hand, the maximum voltage swing DL of the output terminal 22 is calculated by the equation (21), and is approximately 8.5 V. Therefore, the maximum voltage swing DL is about 1.7 times of the breakdown voltage $BV_{CE}$.

As mentioned above, according to the present invention, the output voltage is divided into the respective collector-emitter voltages $V_{CE26}$ and $V_{CE30}$ of the transistors 26 and 30, and hence the output voltage swing DL is expanded to about two times of the breakdown voltage $BV_{CE}$ of the transistors. The above-mentioned output voltage swing is identical with a dynamic range of the output voltage.

In the circuitry as shown in FIG. 3, though the resistors 27 and 28 are connected between the respective emitters of the transistors 26 and 29 and the circuit ground 23, the emitters of the transistors 26 and 29 can be directly connected to the circuit ground.

In the first embodiment, two transistors 26 and 30 are connected in series and in a similar manner, three or over transistors can be connected in series and can divide the output voltage. In this constitution, an output voltage swing which is larger than two times of the breakdown voltage $BV_{CE}$ is realizable.

Figure 5:
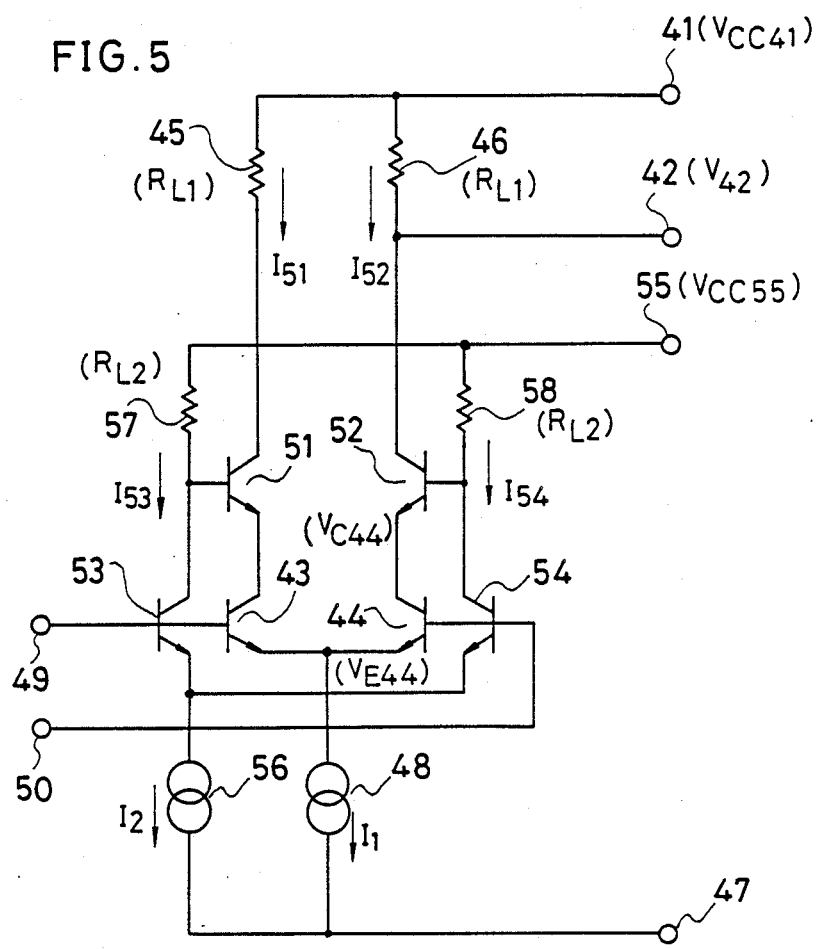
FIG. 5 is the circuitry of a second embodiment of an amplifier in accordance with the present invention.

FIG. 5 is the circuitry of an amplifier of a second embodiment in accordance the present invention. Referring to FIG. 5, a first amplifier is composed of transistors 43, 51 and 53 and resistors 45 and 57, and a second amplifier is composed of transistors 44, 52 and 54 and resistors 46 and 58. A first differential amplifier composed of the transistors 43 and 44 is connected at both the emitters of the transistors 43 and 44 to a first constant current source 48, and a second differential amplifier composed of the transistors 53 and 54 is connected at both the emitters of the transistors 53 and 54 to a second constant current source 56. The bases of the transistors 43 and 53 are connected to a first input terminal 49, and the bases of the transistors 44 and 54 are connected to a second input terminal 50.

A first power source $V_{CC55}$ is a voltage which is lower than the breakdown voltage $BV_{CE}$ of these transistors as shown in a relation 22.

$$V_{CC55} \leq BV_{CE} \quad (22).$$

Further a second power source $V_{CC41}$ is a voltage which is higher than the breakdown voltage $BV_{CE}$ in order to expand the range of the output voltage $V_{42}$ as shown in a relation (23).

$$V_{CC41} > BV_{CE} \quad (23).$$

A current $I_1$ of the constant current source 48 is given by $$I_1 = I_{51} + I_{52} \quad (24),$$

where, $I_{51}$ and $I_{52}$ represent the collector currents of the transistor 51 and the transistor 52, respectively.

Then, a current $I_2$ of the constant current source 56 is given by $$I_2 = I_{53} + I_{54} \quad (25),$$

where, $I_{53}$ and $I_{54}$ represent the collector currents of the transistor 53 and the transistor 54, respectively. In the above-mentioned relation it is provided that the current amplification factor $h_{FE}$ of the transistors is infinite.

A gain $G_1$ of the first differential amplifier composed of the transistors 43 and 44 is given by $$G_1 = \frac{q}{2KT} I_1 \cdot R_{L1}, \quad (26)$$

where,
q: an electric charge of an electron
k: Boltzman constant
T: absolute temperature, and
$R_{L1}$ is the resistances of the resistors 45 and 46.

In a similar manner, a gain $G_2$ of the second differential amplifier composed of the transistors 53 and 54 is given by $$G_2 = \frac{q}{2KT} I_2 \cdot R_{L2}, \quad (27)$$

where, $R_{L2}$ is the resistances of the resistors 57 and 58.

The voltage $V_{42}$ at the output terminal 42 is expressed as:

$$V_{42} = V_{CC41} - I_{52}R_{L1} = V_{CC41} - I_1 R_{L1} \frac{\exp\frac{qV_{50-49}}{KT}}{1 + \exp\frac{qV_{50-49}}{KT}} \quad (28)$$

where, $V_{50-49}$ represents a voltage difference across the input terminals 50 and 49.

Moreover, the collector voltage $V_{C54}$ of the transistor 54 is expressed as:

$$V_{C54} = V_{CC55} - I_{54}R_{L2} = V_{CC55} - I_2 R_{L2} \frac{\exp\frac{qV_{50-49}}{KT}}{1 + \exp\frac{qV_{50-49}}{KT}}. \quad (29)$$

Figure 6:
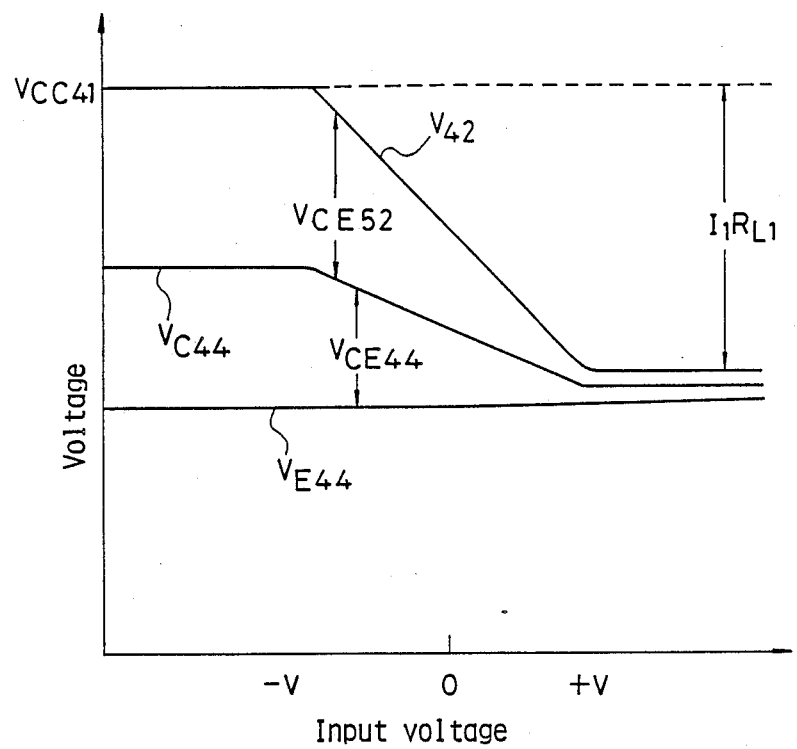
FIG. 6 is a graph illustrating operation of the amplifier as shown in FIG. 5.

FIG. 6 is a graph showing voltages at the respective terminals with respect to a voltage difference $V_{50-49}$. Referring to FIG. 6, the output voltage $V_{42}$ is given by the equation (28), and the collector voltage $V_{C44}$ of transistor 44 is a difference between the collector voltage $V_{C54}$ of the transistor 54 and the voltage $V_{BE52}$ across the base and the emitter of the transistor 52. The voltage $V_{C44}$ is given by the following equation:

$$V_{C44} = V_{CC55} - I_2 R_{L2} \frac{\exp \frac{qV_{50-49}}{KT}}{1 + \exp \frac{qV_{50-49}}{KT}} - V_{BE52}. \quad (30)$$

Then, the emitter voltage $V_{E44}$ of the transistor 44 depends on the voltage difference between the input voltage $V_{49}$ of the input terminal 49 and the input voltage $V_{50}$ of the input terminal 50, and is given by $$V_{50-49} \geq 0 \quad V_{E44} = V_{50} - V_{BE44} \quad (31),$$

where, $V_{BE44}$ represents a voltage across the base and emitter of the transistor 44, $$V_{50-49} < 0 \quad V_{E44} = V_{49} - V_{BE43} \quad (32),$$

where, $V_{BE43}$ represents a voltage across the base and emitter of the transistor 43.

In the amplifier as shown in FIG. 5, even when the maximum voltage swing DL at the output terminal 42 is higher than the breakdown voltage $BV_{CE}$ of the transistor, the collector-emitter voltage $V_{CE}$ of the transistor can be made lower than the breakdown voltage $BV_{CE}$. The reason is as follows. Now, referring to FIG. 6, the voltage difference between carves $V_{42}$ and $V_{C44}$ is a voltage $V_{CE52}$ across the collector and emitter of the transistor 52, and a voltage difference between carves $V_{C44}$ and $V_{E44}$ is a voltage $V_{CE44}$ across the collector and emitter of the transistor 44. The maximum voltage swing LD of the output voltage $V_{42}$ is given by $$DL = I_1 R_{L1} \quad (33).$$

A collector-emitter voltage $V_{CE52}$ which is a voltage across the collector and the emitter of the transistor 52 is given by $$V_{CE52} = V_{CC41} - V_{CC55} + V_{BE52} + I_2 R_{L2}\left(1 - \frac{I_1 R_{L1}}{I_2 R_{L2}}\right). \quad (34)$$

The collector-emitter voltage $V_{CE44}$ of the transistor 44 is given by $$V_{CE44} = V_{CC55} - I_2 R_{R2}\alpha - V_{BE52} - V_{50} + V_{BE44}, \quad (35)$$

where; $\alpha = \dfrac{\exp \frac{qV_{50-49}}{KT}}{1 + \exp \frac{qV_{50-49}}{KT}}$.

Furthermore, the collector-emitter voltage $V_{CE54}$ of the transistor 54 is given by $$V_{CE54} = V_{CC55} - I_2 R_{L2}\alpha - V_{50} + V_{BE54} \quad (36),$$

where, $V_{BE54}$ represent a voltage across the base and emitter of the transistor.

Provided that the following relations (37), (38) and (39) hold:

$$I_1 R_{L1} > I_2 R_{L2} \quad (37),$$

$$BV_{CE} \geq V_{CC55} \quad (38),$$

$$I_1 R_{R1} > BV_{CE} > V_{CC41} - V_{CC55} + V_{BE} \quad (39),$$

the maximum collector-emitter voltage $V_{CEmax52}$ of the transistor 52 is given by $$V_{CEmax52} = V_{CC44} - V_{CC55} + V_{BE52} \quad (40).$$

The maximum collector-emitter voltage $V_{CEmax44}$ of the transistor 44 is given by $$V_{CEmax44} = V_{CC55} - V_{50} \quad (41),$$

and the maximum collector-emitter voltage $V_{CEmax54}$ of the transistor 54 is given by $$V_{CEmax54} = V_{CC55} - V_{50} + V_{BE54} \quad (42).$$

In a similar manner the maximum collector-emitter voltage $V_{CEmax51}$ of the transistor 51 is equal to the maximum collector-emitter voltage $V_{CEmax51}$ of the transistor 51. The maximum collector-emitter voltage $V_{CEmax43}$ of the transistor 43 is equal to the maximum collector-emitter voltage $V_{CEmax44}$. And the maximum collector-emitter voltage $V_{CEmax53}$ is equal to the maximum collector-emitter voltage $V_{CEmax54}$.

The collector-emitter voltages of the transistors 43, 44, 53 and 54 are less than the breakdown voltage $BV_{CE}$ as shown by the equations (41) and (42) under the condition as shown by the relation (38). And, the collector-emitter voltage of the transistors 51 and 52 is less than the breakdown voltage $BV_{CE}$ under the condition as shown in the relation (39). In other words, as a conclusion, in case that the respective circuit elements are selected so as to fulfill the relations (37), (38) and (39), the collector-emitter voltage $V_{CE}$ of the respective transistor can be made less than the breakdown voltage $BV_{CE}$, and hence, an output voltage swing which is higher than the breakdown voltage $BV_{CE}$ is output.

For one example, the relations (37), (38) and (39) are fulfilled under the following selection: $V_{CC41} = 9$ V, $V_{CC55} = 5$ V, $I_1 = I_2 = 1$ mA, $BV_{CE} = 5$ V, $R_{L1} = 8$ kΩ, $R_{L2} = 4.8$ kΩ, $V_{49} = V_{50} = 1$ V. The maximum voltage swing DL at the output terminal 42 is calculated by the equation (33), and is 8 V ($DL = I_1 R_{L1} = 8$ V). As shown above, the maximum voltage swing DL is 1.6 times of the breakdown voltage $BV_{CE}$. The maximum collector-emitter voltages $V_{CEmax}$ of the respective transistors are calculated by the equations (40), (41) and (42) as shown below:

$$V_{CEmax52} = V_{CC41} - V_{55} + V_{BE52} \approx 4.7 \text{ V} \quad (40),$$

$$V_{CEmax44} = V_{CC55} - V_{50} = 4 \text{ V} \quad (41),$$

$$V_{CEmax54} = V_{CC55} - V_{50} + V_{BE54} \approx 4.7 \text{ V} \quad (42).$$

As is understood from the foregoing example, the maximum collector-emitter voltages of the respective transistors are less than the breakdown voltage $BV_{CE}$ of 5 V.

In the second embodiment, the collector voltage and the base voltage of the transistor 51 or 52 are varied in the same phase by the transistors 43 and 53 or transistors 44 and 54 in which a common input voltage is applied to the bases of the transistors 43 and 53 or the other common input voltage is applied to the bases of the transistors 44 and 54, respectively. Then, the collector voltage of the transistor 51 is a sum of the collector-emitter voltages $V_{CE}$ of the transistor 51 and the transistor 43, and the collector voltage $V_{52}$ of the transistor 52 is a sum of the collector-emitter voltage $V_{CE}$ of the transistor 52 and the collector-emitter voltage $V_{CE}$ of the transistor 44. Thus, the maximum output voltage at the output terminal 42 can be expanded to two times of the breakdown voltage $BV_{CE}$ of transistors.

Resistors are usable as replacements for the constant current sources 48 and 56 in the second embodiment.

In the amplifier of the second embodiment, though the output voltage is divided into the respective collector-emitter voltages $V_{CE}$ of two transistors 44 and 52, the output voltage can be divided into the respective collector-emitter voltages $V_{CE}$ of three or more transistors which are connected in series (not shown).

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. An amplifier comprising:
a first transistor connected at the emitter to a circuit ground through a first resistor,
a second transistor connected at the emitter to the collector of said first transistor and connected at the collector to an output terminal and through a second resistor to a first power source of a voltage which is higher than the breakdown voltage of the transistors, and
a third transistor connected at the collector to the base of the second transistor and through a third resistor to a second power source, connected at the base to the base of said first transistor and connected at the emitter to said circuit ground through a fourth resistor.

2. An amplifier comprising:
a first transistor connected at the emitter to a circuit ground through a first constant current source,
a second transistor connected at the emitter to the collector of said first transistor and connected at the collector to a first power source of a voltage which is higher than the breakdown voltage of the transistors through a first resistor,
a third transistor connected at the collector to the base of the second transistor and through a second resistor to a second power source, connected at the base to the base of said first transistor and connected at the emitter to said circuit ground through a second constant current source,
a fourth transistor connected at the emitter to the emitter of said first transistor,
a fifth transistor connected at the emitter to the collector of said fourth transistor and connected at the collector through a third resistor to said first power source, and
a sixth transistor connected at the collector to the base of said fifth transistor and said second power source through a fourth resistor, connected at the base to the base of said fourth transistor and connected at the emitter to the emitter of said third transistor.

* * * * *